(12) United States Patent
Chen

(10) Patent No.: US 6,872,630 B1
(45) Date of Patent: Mar. 29, 2005

(54) USING V-GROOVE ETCHING METHOD TO REDUCE ALIGNMENT MARK ASYMMETRIC DAMAGE IN INTEGRATED CIRCUIT PROCESS

(75) Inventor: Yi-Lin Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/170,247

(22) Filed: Jun. 12, 2002

(51) Int. Cl.⁷ .............................................. H01L 21/76
(52) U.S. Cl. ...................................................... 438/401
(58) Field of Search ............................... 438/424, 427, 438/401, 701; 257/797

(56) References Cited

U.S. PATENT DOCUMENTS

| | | | |
|---|---|---|---|
| 5,677,091 A | 10/1997 | Barr et al. | 430/5 |
| 5,701,013 A | 12/1997 | Hsia et al. | 250/491.1 |
| 5,776,645 A | 7/1998 | Barr et al. | 430/22 |
| 5,923,041 A | 7/1999 | Cresswell et al. | 250/491.1 |
| 6,022,650 A | 2/2000 | Sogawa | 430/22 |
| 6,077,756 A | 6/2000 | Lin et al. | 438/401 |
| 6,194,287 B1 * | 2/2001 | Jang | 438/427 |
| 6,215,197 B1 * | 4/2001 | Iwamatsu | 257/797 |
| 6,303,460 B1 * | 10/2001 | Iwamatsu | 438/401 |
| 6,433,401 B1 * | 8/2002 | Clark et al. | 257/524 |
| 6,770,213 B2 * | 8/2004 | Antaki et al. | 216/59 |
| 2002/0197868 A1 * | 12/2002 | Endoh et al. | 438/689 |

FOREIGN PATENT DOCUMENTS

JP          02002134701 A * 5/2002 ........... H01L/27/08

OTHER PUBLICATIONS

Sorab K. Ghandi VLSI Fabrication Principles John Wiley and Sons, Publishers 1994, pp. 598–601.*

* cited by examiner

Primary Examiner—David S Blum

(57) ABSTRACT

A new method is provided for the creation of an alignment mark. V-groove etching is applied whereby this anisotropic etch stops at the (1,1,1) crystal direction of the silicon of the substrate. The invention applies a wet etchant to the surface of monocrystalline silicon of the silicon substrate by using a solution containing a mixture of potassium hydroxide (KOH) or $N_2H_4$ or tetramethyl ammonium hydroxide (TMAH). This solution anisotropically etches the silicon substrate, forming grooves in the substrate having sidewalls that are sloped at an angle of about 54 degrees with the horizontal. The slope of the sidewalls is a function of the different etch rates of monocrystalline silicon along the different crystalline orientations. The surface of the substrate represents <100> planes of the silicon, which etches faster than the sloped sidewalls that represent the <111> plane. The $KOH/N_2H_4/TMAH$ etch stops on the <111> plane of the silicon substrate.

11 Claims, 2 Drawing Sheets

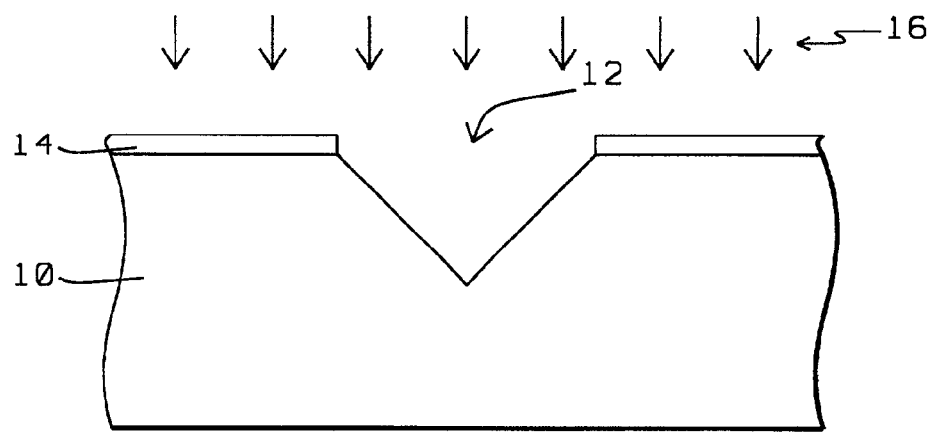
FIG. 1
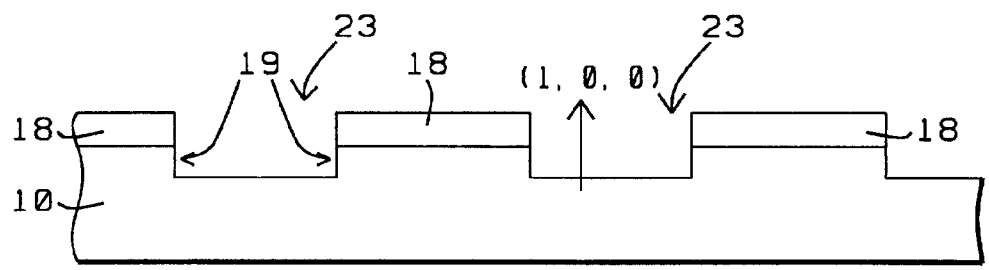
FIG. 2 – Prior Art
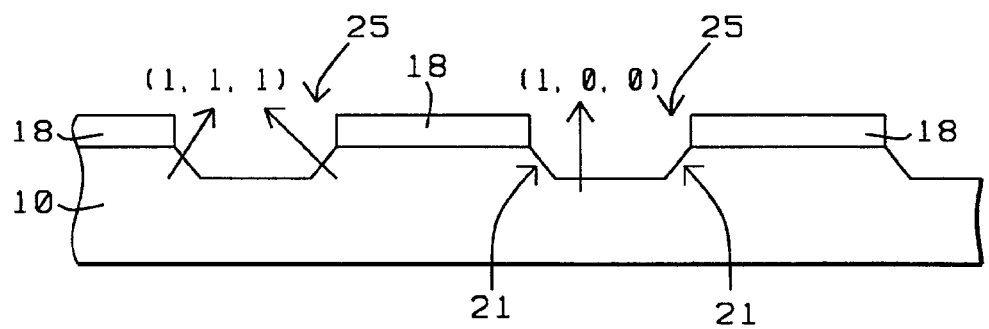
FIG. 3

USING V-GROOVE ETCHING METHOD TO REDUCE ALIGNMENT MARK ASYMMETRIC DAMAGE IN INTEGRATED CIRCUIT PROCESS

BACKGROUND OF THE INVENTION (1) Field of the Invention

The invention relates to the fabrication of integrated circuit devices, and more particularly, to a method that prevents damage to the alignment mark during steps of semiconductor device processing by creating an alignment mark comprising V-shaped grooves.

(2) Description of the Prior Art

The creation of semiconductor devices makes frequent use of creating overlying or other patterns of interacting device features that must be closely aligned with each other. Semiconductor device processing comprises the deposition and patterning of layers of semiconductor materials such as layers of dielectric or insulating materials, polysilicon layers in doped or undoped form or other layers of conductive material comprising for instance metal or metal alloys. The patterning of these layers, with the objective of creating specific device features therein, typically uses a photoresist mask overlying the layer that is to be patterned. The deposited layer of photoresist is exposed using a photomask that contains the pattern that is to be creating in the layer of photoresist, resulting in the photoresist mask. The photomask or reticle uses an alignment mark in the surface thereof for purposes of, in a cooperative effort with an alignment mark provided over the surface of a substrate, accurately aligning overlying or interacting patterns that must be created in mutually cooperative layers of semiconductor material. This task of accurate alignment of the patterns that are created in the various layers of a semiconductor device becomes more demanding as device features continue to decrease in size and as semiconductor devices continue to increase in density.

It must thereby further be considered that semiconductor devices are created using substrates of increased diameter, making uniform exposure of a deposited layer of semiconductor material over the surface of the substrate more difficult. A source of exposure that for instance is positioned centrally located to the surface of the substrate will radiate energy to the surface of the substrate such that this energy impacts the surface of the substrate under a decreasing angle as the impacted energy progresses towards the perimeter of the substrate. This therefore causes an asymmetry of exposure, whereby the center of the substrate is impacted under an angle of about ninety degrees, which angle however decreases towards the perimeter of the substrate. Where it therefore may be expected that, in the center of the substrate, features of a rectangular cross section can be created, this cross section will deviate significantly from the rectangular form the more the perimeter of the substrate is approached. This asymmetry results in a distortion of the signal that is reflected by the alignment mark, which is typically located in the perimeter of the substrate, a signal that is detected and processed by the exposure tool such as a photoresist exposure tool. The accuracy of alignment is also negatively affected by asymmetry in the alignment mark, which is typically provided over the surface of a substrate that is being processed. The invention addresses problems of asymmetry in the alignment mark.

U.S. Pat. No. 5,701,013 (Hsia et al.) shows a metrology pattern with overlay and Critical Dimension (CD) features.

U.S. Pat. No. 5,923,041 (Cresswell et al.) discloses an overlay target and measurement process.

U.S. Pat. No. 6,077,756 (Lin et al.), U.S. Pat. No. 5,677,091 (Barr et al.), U.S. Pat. No. 6,022,650 (Sogawa) and U.S. Pat. No. 5,776,645 (Barr et al.) are related patents.

SUMMARY OF THE INVENTION

A principle objective of the invention is to remove asymmetric damage to an alignment mark that is created over the surface of a substrate.

Another objective of the invention is to improve alignment mark accuracy.

Yet another objective of the invention is to create an alignment mark that is not subject to damage due to processes of Chemical Mechanical Polishing of the surface in which the alignment mark has been created.

A still further objective of the invention is to reduce the shadow effect during the deposition of metal for processing steps that do not use mark-shielding technology.

A still further objective of the invention is to remove side effects on the alignment mark that are introduced by high-order defraction light.

In accordance with the objectives of the invention a new method is provided for the creation of an alignment mark. V-groove etching is applied whereby this-anisotropic etch stops at the (1,1,1) crystal direction of the silicon of the substrate. The invention applies a wet etchant to the surface of monocrystalline silicon of the silicon substrate by using a solution containing a mixture of potassium hydroxide (KOH) or $N_2H_4$ or tetramethyl ammonium hydroxide (TMAH). This solution anisotropically etches the silicon substrate, forming grooves in the substrate having sidewalls that are sloped at an angle of about 54 degrees with the horizontal. The slope of the sidewalls is a function of the different etch rates of monocrystalline silicon along the different crystalline orientations. The surface of the substrate represents <100> planes of the silicon, which etches faster than the sloped sidewalls that represent the <111> plane. The $KOH/N_2H_4/TMAH$ etch stops on the <111> plane of the silicon substrate.

BRIEF DESCRIPTION OF THE DRAWINGS

FIG. 1 shows a cross section of a V-shaped alignment mark of the invention.

FIG. 2 shows a cross section of a conventional method of creating an alignment mark.

FIG. 3 shows a cross section of the method of the invention for the creation of alignment mark.

DESCRIPTION OF THE PREFERRED EMBODIMENTS

Figure 4A:
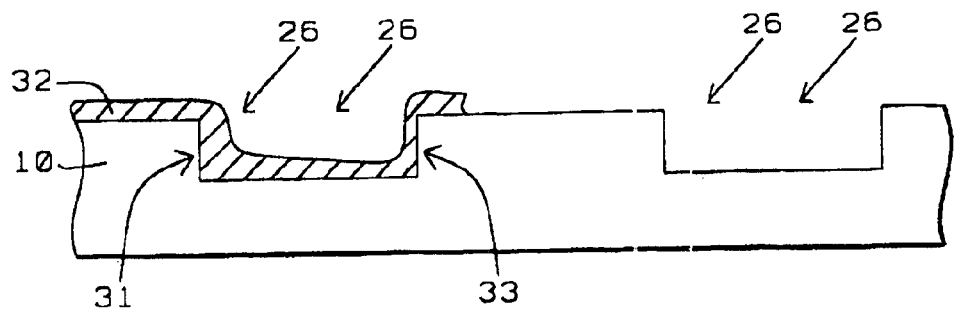
FIGS. 4a and 4b show the effect that sputter, such as metal sputter, has on the profile of the alignment mark using a conventional alignment mark (FIG. 4a) and the alignment mark of the invention (FIG. 4b).

One of the most frequently applied methods for planarizing a surface of semiconductor material is the use of Chemical Mechanical Polishing (CMP). It is however well known in the art that this method of polishing a surface is prone to create unwanted results on the surface that is being polished.

For instance, CMP can result in uneven polishing across the surface of a large substrate, removing more of the polished material in for instance the center of the substrate when compared with the perimeter of the substrate. Steps or sharp changes in the profile of the surface that is being polished introduce problems of uneven polishing in the immediate vicinity of these sharp changes. Dishing in the surface that is being polished is a well known problem, whereby material is removed at the center of the polished surface at a faster rate than the removal rate around the perimeter of the surface that is being polished. These and other influences have a negative effect on the shape of the alignment mark that is provided in the surface of the substrate for purposes of substrate alignment.

The light that is typically reflected by the alignment mark is captured and analyzed by the alignment tool, using complex arrangements that start with a laser as the source of an exposing light. Typically, an arrangement of lenses is used to properly direct and focus the light to the alignment mark that is provided over the surface of the substrate. The light that is reflected by the alignment mark contains a pattern of diffracted light beams, whereby the diffracted light is represented by Fourier components that collectively create a light wave of a defined nature. A square wave pattern can, in accordance with conventional Fourier analysis, by broken down in contributing orders of waves, starting at a zero component (which represents the intensity of the emitted light), to a first order component (which represents a relatively low frequency sinusoidal wave), to a third order, a fifth order etc. components or waves of increasing frequency. The collective contribution of these components represents the square function as closely as possible, the higher the number of contribution components, the closer the combined function resembles a square wave.

In this Fourier analysis of a square (wave) function, the first order component reflects the center of "gravity" of the wave, that is the intensity (or amplitude) of the square wave. The higher order components carry information about the edges of the square wave, these edges are generally undistorted. Some light detection systems are based on not adding higher frequency components of the light that is analyzed. Some light detection systems are based on detecting separate components and analyzing each of these components, providing special information relating to the light that is analyzed. It is known in the art that the more components of higher frequencies are included in recreating the reflected light, the closer the reflected light resembles the square wave representation of the original light.

The reason that this is of importance is that the higher orders of the reflected light add to the accuracy of analyzing the light that is reflected by the alignment mark and therefore the accuracy of using the alignment mark for alignment purposes. If therefore, due to over-polishing the alignment mark in an unsymmetrical manner, and over-polishing one side of the sidewalls of the alignment mark, while the first order of the diffraction pattern carries only information about the center of gravity of these sidewalls, the first order alignment position will be shifted slightly in a direction away from the over-polished sidewall, resulting in misalignment of the wafer.

Another problem that is encountered using an alignment mark that has a square cross section is that the alignment mark will experience asymmetric sputtering from a centrally located source of for instance metal.

The sidewall of the alignment mark that is more exposed to the source of sputtering material will receive a disproportionately larger amount of the sputtered material than the sidewall that is essentially hidden from the source of sputtering, due to the angle of impact of the sputtered material. This also results in a shifting of the alignment mark from its original position, up to the time that the sputtered material is etched from the surface.

For these and other reasons, the invention provides an alignment mark of V-shaped cross section that is shown in the cross section of FIG. 1. Highlighted in the cross section of FIG. 1 are the surface 10 of a silicon substrate into which the V-shaped alignment mark 12 is etched using a patterned and developed etch stop layer 14, typically comprising silicon dioxide.

Applied for the etch 16 can be any of the following etchants:
1. potassium hydroxide (KOH) or
2. $N_2H_4$ or
3. tetramethyl ammonium hydroxide (TMAH).

TMAH can be advantageously applied for this purpose since TMAH is a metal-ion free developer, which reduces metal-ion diffusion and contamination in other parts of the IC.

The indicated etchants anisotropically etch a silicon substrate 10, FIG. 1, forming groove 12 in the substrate having sidewalls that are sloped at an angle of about 54 degrees with the horizontal. The slope of the sidewalls is a function of the different etch rates of monocrystalline silicon along the different crystalline orientations. The surface of the substrate represents <100> planes of the silicon, which etches faster than the sloped sidewalls that represent the <111> plane. From this it is clear that the V-shaped groove 12 can be created in the surface of the silicon substrate 10.

FIGS. 2 and 3 show, for purposes of comparison, the conventional method of creating an alignment mark (FIG. 2) and the method of the invention for the creation of an alignment mark (FIG. 3).

The vertical sidewalls of the conventional grooves 23 of the alignment marks are highlighted as sidewalls 19 in the cross section of FIG. 2, created applying dry etching. The sloped sidewalls of the alignment mark 25 of the invention are highlighted in the cross section of FIG. 3 as elements 21. The <1,0,0> plane of the silicon and the <1,1,1> plane of the silicon substrate have been highlighted, further explaining how, in the cross section of FIG. 3, the sloped sidewalls 21 of the alignment marks are created.

Layer 18 is typically a patterned and developed etch stop layer of silicon dioxide, formed over the surface of substrate 10.

As an added aspect of the creation of the sloping sidewalls of the alignment mark of the invention the following is highlighted. Shallow Trench Isolation regions are frequently created in the surface of the substrate for reasons of inter-device isolation. After the trenches in the surface of the substrate have been created for the STI regions, these trenches are filled with an isolation oxide after which the excess oxide is removed from the surface of the substrate applying methods of CMP. Slurry is an abrasive components that is typically applied to the interface between a polishing pad and the surface that is being polished in order to enhance the polishing action. This slurry contains as one of the abrasive components a KOH component. Since, using the method of the invention that stops on the the <1,1,1> plane of the silicon substrate, this KOH components of the polishing slurry will also stop on the <1,1,1> plane of the silicon substrate and will therefore not affect the alignment mark that has been created in accordance with the invention. In addition, since both sidewalls of the V-shaped trench of the alignment mark of the invention have been created symmetrically stopping on the <1,1,1> plane of the silicon substrate, the symmetry of the V-shaped groove will not be disturbed.

Further, since the sloping sides of the alignment mark of the invention present a less abrupt interface to a thereover applied polishing pad, the groove shaped and therefore slightly rounded corners of the V-shaped grooves present less mechanical stress in the interface between the polishing pad and the surface that is being polished. Conventional polishing pad usage will therefore benefit with less damage to the polishing pad and therefore a longer time of application of the polishing pad.

Figure 4B:
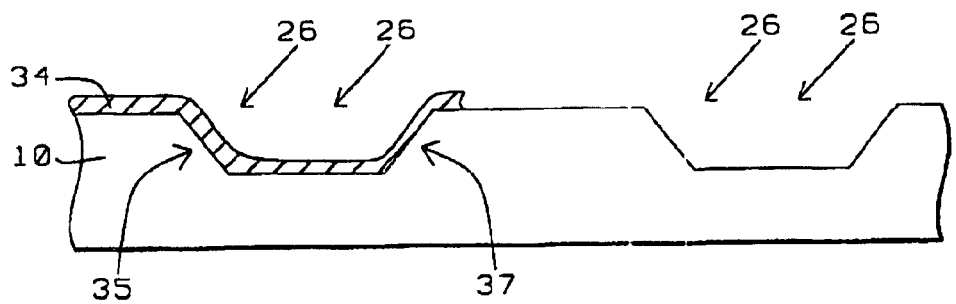

FIGS. 4a and 4b show the effect that sputter, such as metal sputter 26, has on the profile of the alignment mark using a conventional alignment mark (FIG. 4a) and the alignment mark of the invention (FIG. 4b).

The salient difference between the cross sections of FIGS. 4a and 4b, from a sputter deposition point of view, is that side 31 of the conventional alignment mark is a sidewall that is under a relatively sharp angle with the direction of the sputter deposition 26, this sidewall will therefore accumulate a significant amount of the sputtered material such as metal. All the other sides of the alignment mark that are shown in the cross sections of FIGS. 4a and 4b can be expected to receive about equal amounts of the sputtered material by either direct deposition or by scatter effect of the sputtered material. From this it can be concluded that the difference in thickness of the sputter material that is deposited over sidewalls 31 and 33 is larger than the difference in thickness of the sputter material that is deposited over sidewalls 35 and 37. This is another way of saying that the sputter shadow effect is less pronounced in the cross section that is shown in FIG. 4b, the alignment mark of the invention, than is the case for the cross section that is shown in FIG. 4a. The alignment error that is typically introduced by the sputter shadow effect is therefore reduced by creating an alignment mark having sloping sidewalls.

Figure 5:
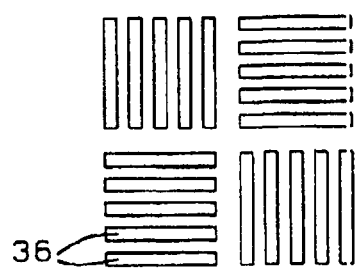
FIG. 5 shows a top view of a complete alignment mark of the invention, comprising V-shaped grooves.

FIG. 5 shows a top view of a complete alignment mark of the invention whereby the pattern of the alignment mark is a conventional pattern but the cross section of the trenches 36 of the alignment mark, taken in a plane that is perpendicular to the direction of the longest side of the trenches 36, is V-shaped.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to reduce alignment mark asymmetry, comprising the steps of:
   providing a monocrystalline silicon substrate having a first crystal orientation; and
   anisotropically etching said substrate by applying a wet etchant to the monocrystalline silicon substrate, stopping at a plane of second crystal orientation of said substrate, thereby forming V-shaped grooves in the substrate having sidewalls that are sloped at an angle with the substrate, said V-shaped grooves being used for alignment marks.

2. The method of claim 1, said anisotropically etching comprising an etchant gas selected from the group consisting of potassium hydroxide (KOH) and $N_2H_4$ and tetramethyl ammonium hydroxide (TMAH).

3. The method of claim 1, wherein said first crystal orientation is a <1,0,0> crystal orientation.

4. The method of claim 1, wherein said second crystal orientation is a <1,1,1> crystal orientation.

5. A method of creating an alignment mark over a silicon substrate, comprising the steps of:
   providing a monocrystalline silicon substrate having a first crystal orientation;
   depositing a layer of etch stop material over said substrate;
   patterning and etching said layer of etch stop material, thereby creating a pattern in said layer of etch stop material that aligns with a pattern of said alignment mark, exposing said substrate;
   anisotropically etching said substrate by applying a wet etchant to the monocrystalline silicon substrate, stopping at a plane of second crystal orientation of said substrate, thereby forming V-shaped grooves in the substrate having sidewalls that are sloped at an angle with the substrate; and
   removing said patterned and etched layer of etch stop material from said substrate, said V-shaped grooves being used for alignment marks.

6. The method of claim 5, said anisotropically etching comprising an etchant gas selected from the group consisting of potassium hydroxide (KOH) and $N_2H_4$ and tetramethyl ammonium hydroxide (TMAH).

7. The method of claim 5, wherein said first crystal orientation is a <1,0,0> crystal orientation.

8. The method of claim 5, wherein said second crystal orientation is a <1,1,1> crystal orientation.

9. A method of creating an alignment mark over a silicon substrate, comprising the steps of:
   providing a monocrystalline silicon substrate having a first crystal orientation;
   depositing a layer of etch stop material over said substrate;
   patterning and etching said layer of etch stop material, thereby creating a pattern in said layer of etch stop material that aligns with a pattern of said alignment mark, exposing said substrate;
   anisotropically etching said substrate by applying a wet etchant to the monocrystalline silicon substrate, stopping at a plane of second crystal orientation of said substrate, said anisotropically etching comprising an etchant gas selected from the group consisting of potassium hydroxide (KOH) and $N_2H_4$ and tetramethyl ammonium hydroxide (TMAH), thereby forming V-shape grooves in the substrate having sidewalls that are sloped at an angle with the substrate; and
   removing said patterned and etched layer of etch stop material from said substrate said V-shape grooves being used for alignment marks.

10. The method of claim 9, wherein said first crystal orientation is a <1,0,0> crystal orientation.

11. The method of claim 9, wherein said second crystal orientation is a <1,1,1> crystal orientation.

* * * * *